(12) United States Patent
Kim et al.

(10) Patent No.: US 8,274,112 B2
(45) Date of Patent: Sep. 25, 2012

(54) SEMICONDUCTOR MEMORY DEVICE HAVING PILLAR STRUCTURES

(75) Inventors: Hui-Jung Kim, Seoul (KR); Yong-Chul Oh, Suwon-si (KR); Hyun-Woo Chung, Seoul (KR); Hyun-Gi Kim, Hwaseong-si (KR); Kang-Uk Kim, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 271 days.

(21) Appl. No.: 12/689,258

(22) Filed: Jan. 19, 2010

(65) Prior Publication Data

US 2010/0181613 A1    Jul. 22, 2010

(30) Foreign Application Priority Data

Jan. 19, 2009   (KR) ................ 10-2009-0004043

(51) Int. Cl.
*H01L 29/78* (2006.01)
(52) U.S. Cl. ................. 257/331; 257/E29.262
(58) Field of Classification Search .......... 257/301, 257/331, E27.088, E27.091, E29.262
See application file for complete search history.

(56) References Cited

U.S. PATENT DOCUMENTS

| 7,285,812 B2 | 10/2007 | Tang et al. |
| 2008/0211013 A1* | 9/2008 | Seo et al. ............. 257/328 |

FOREIGN PATENT DOCUMENTS

| KR | 10-0688576 | 2/2007 |
| KR | 10-0771871 | 10/2007 |
| KR | 1020080017391 A | 2/2008 |

* cited by examiner

*Primary Examiner* — Thomas L Dickey
(74) *Attorney, Agent, or Firm* — Volentine & Whitt, PLLC (57) ABSTRACT

A semiconductor memory device includes first and second active pillar structures protruding at an upper part of a substrate, buried bit lines each extending in a first direction, and first gate patterns and second gate patterns each extending in a second direction. The first and second active pillar structures occupy odd-numbered and even-numbered rows, respectively. The first and the second active pillar structures also occupy even-numbered and odd-numbered columns, respectively. The columns of the second active pillar structures are offset in the second direction from the columns of the first active pillar structures. Each buried bit line is connected to lower portions of the first active pillar structures which occupy one of the even-numbered columns and to lower portions of the second active pillar structures which occupy an adjacent one of the odd-numbered columns.

17 Claims, 11 Drawing Sheets

SEMICONDUCTOR MEMORY DEVICE HAVING PILLAR STRUCTURES

PRIORITY STATEMENT

This application claims priority under 35 U.S.C. §119 to Korean Patent Application No. 2009-4043, filed on Jan. 19, 2009 in the Korean Intellectual Property Office (KIPO).

BACKGROUND

1. Field

The inventive concept relates to semiconductor memory devices and methods of manufacturing semiconductor memory devices. More particularly, the inventive concept relates to semiconductor memory devices including vertical pillar type of transistors and methods of manufacturing semiconductor memory devices having vertical pillar type of transistors.

2. Description of the Related Art

Recently, the degree of integration of semiconductor memory devices has been improved through the use of vertical pillar type of transistors in the cell regions of the devices. In this respect, a vertical pillar type of transistor includes a semiconductor pillar extending perpendicular to the substrate. As the degree of integration of semiconductor memory devices has been further increased, the widths of the semiconductor pillars, as well as the distance between adjacent semiconductor pillars have become smaller. Accordingly, the wirings in the semiconductor memory device are becoming narrower and are being spaced closer together. Therefore, the resistance of the wiring is becoming greater, and electrical shorts between adjacent wirings are occurring more frequently. As a result, highly integrated semiconductor memory devices that include vertical pillar type of transistors may exhibit poor response speed and in general, may possess poor electrical characteristics.

SUMMARY

According to one aspect of the inventive concept, there is provided a semiconductor memory device including rows and columns of active pillar structures protruding from a surface of the device, in which odd and even rows of the active pillar structures are alternately disposed in a first direction, odd and even columns of the active pillar structures are alternately disposed in a second direction, the odd rows and the even columns of the active pillar structures each consist of a plurality of first ones of the active pillar structures, the even rows and the odd columns of the active pillar structures each consist of a plurality of second ones of the active pillar structures, and the columns of the second active pillar structures are offset in the second direction from the columns of the first active pillar structures.

The semiconductor memory device also includes buried bit lines each extending longitudinally in the first direction and electrically connected to more than one adjacent column of the active pillar structures. That is, each of the buried bit lines is electrically connected to the first pillar structures which make up one of the even columns of the active pillar structures and to the second active pillar structures which make up an adjacent one of the odd columns of the active pillar structures. The buried bit lines are electrically connected to the first and second active pillar structures at lower portions thereof.

According to another aspect of the inventive concept, there is provided a method of manufacturing a semiconductor memory device, which includes forming an array of active pillar structures, constituted by rows and columns of the active pillar structures, forming buried bit lines electrically connected to the active pillar structures, and forming first and second gate patterns, wherein each of the active pillar structures protrudes from a surface of the device, odd and even rows of the active pillar structures are alternately disposed in a first direction, odd and even columns of the active pillar structures are alternately disposed in a second direction, the odd rows and the even columns of the active pillar structures each consist of a plurality of first ones of the active pillar structures, the even rows and the odd columns of the active pillar structures each consist of a plurality of second ones of the active pillar structures, and the columns of the second active pillar structures are offset in the second direction from the columns of the first active pillar structures.

The buried bit lines are formed such that each of the buried bit lines extends longitudinally in the first direction, and each of the buried bit lines is electrically connected to the first pillar structures which make up one of the even columns of the active pillar structures and to the second active pillar structures which make up an adjacent one of the odd columns of the active pillar structures.

The first gate patterns are formed so as to each extend longitudinally in the second direction and surround central portions of the first active pillar structures which make up a respective one of the odd rows of the active pillar structures. The second gate patterns are formed so as to each extending longitudinally in the second direction and surround central portions of the second active pillar structures which make up a respective one of the even rows of the active pillar structures

BRIEF DESCRIPTION OF DRAWINGS

The inventive concept will be more clearly understood from the following detailed description of embodiments thereof that follows, as taken in conjunction with the accompanying drawings.

DETAILED DESCRIPTION OF EMBODIMENTS

Embodiments of the inventive concept will now be described more fully with reference to the accompanying drawings. Like reference numbers designate like elements throughout the drawings. Also, in the drawings, the thicknesses of layers and regions may be exaggerated for clarity. In particular, the cross-sectional illustrations of the memory device and intermediate structures fabricated during the course of its manufacture are schematic. Thus, the memory device is not to be construed as limited by the particular shapes and relative sizes of elements and regions of the cells illustrated herein; rather, the particular shapes and relative sizes of such elements and regions may in practice deviate from those illustrated due, for example, to manufacturing techniques and tolerances.

Furthermore, spatially relative terms, such as "upper," and "lower" are used to describe an element's and/or feature's relationship to another element(s) and/or feature(s) as illustrated in the figures. Thus, the spatially relative terms may apply to orientations in use which differ from the orientation depicted in the figures. Obviously, though, all such spatially relative terms refer to the orientation shown in the drawings for ease of description and are not necessarily limiting as embodiments according to the inventive concept can assume orientations different than those illustrated in the drawings when in use.

Figure 1:
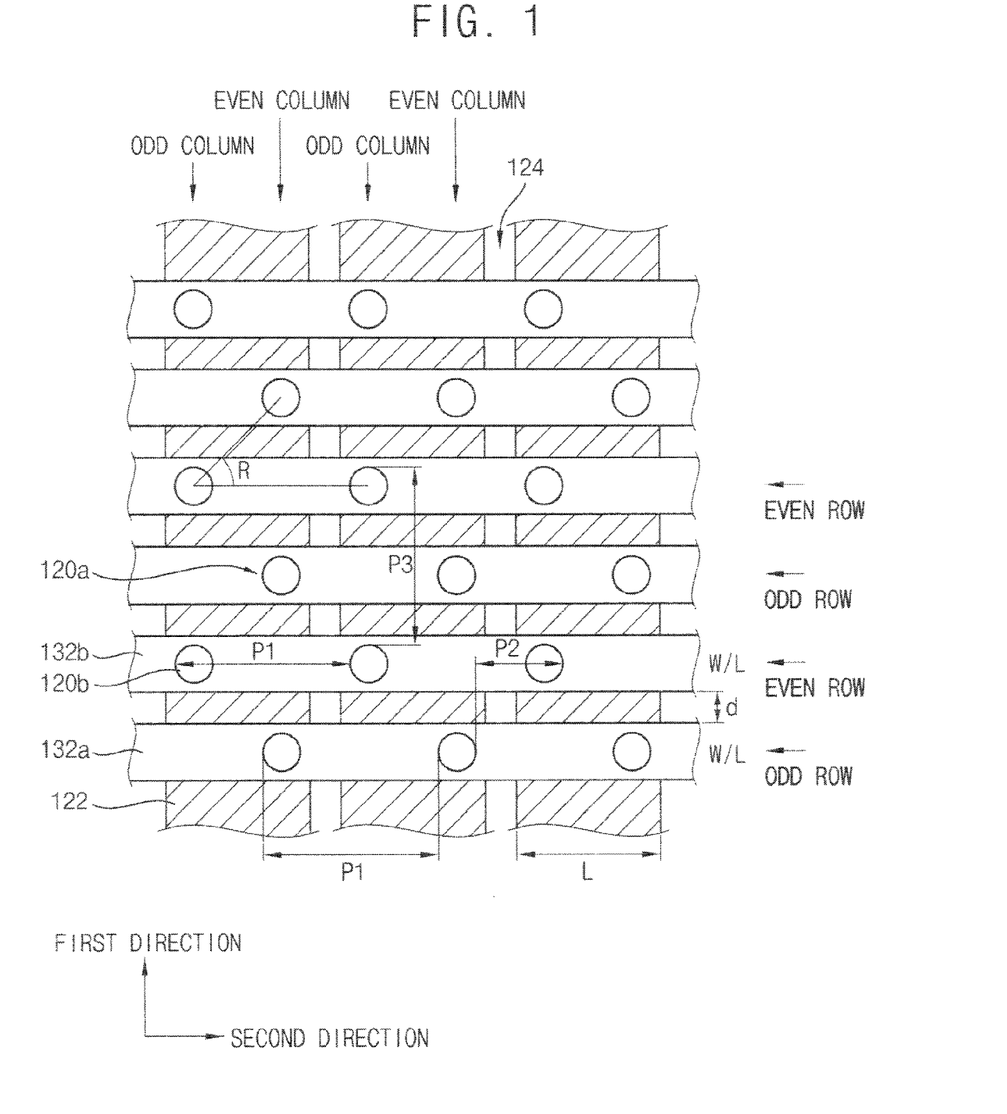
FIG. 1 is a plan view of an embodiment of a semiconductor memory device in accordance with the inventive concept.
Figure 2:
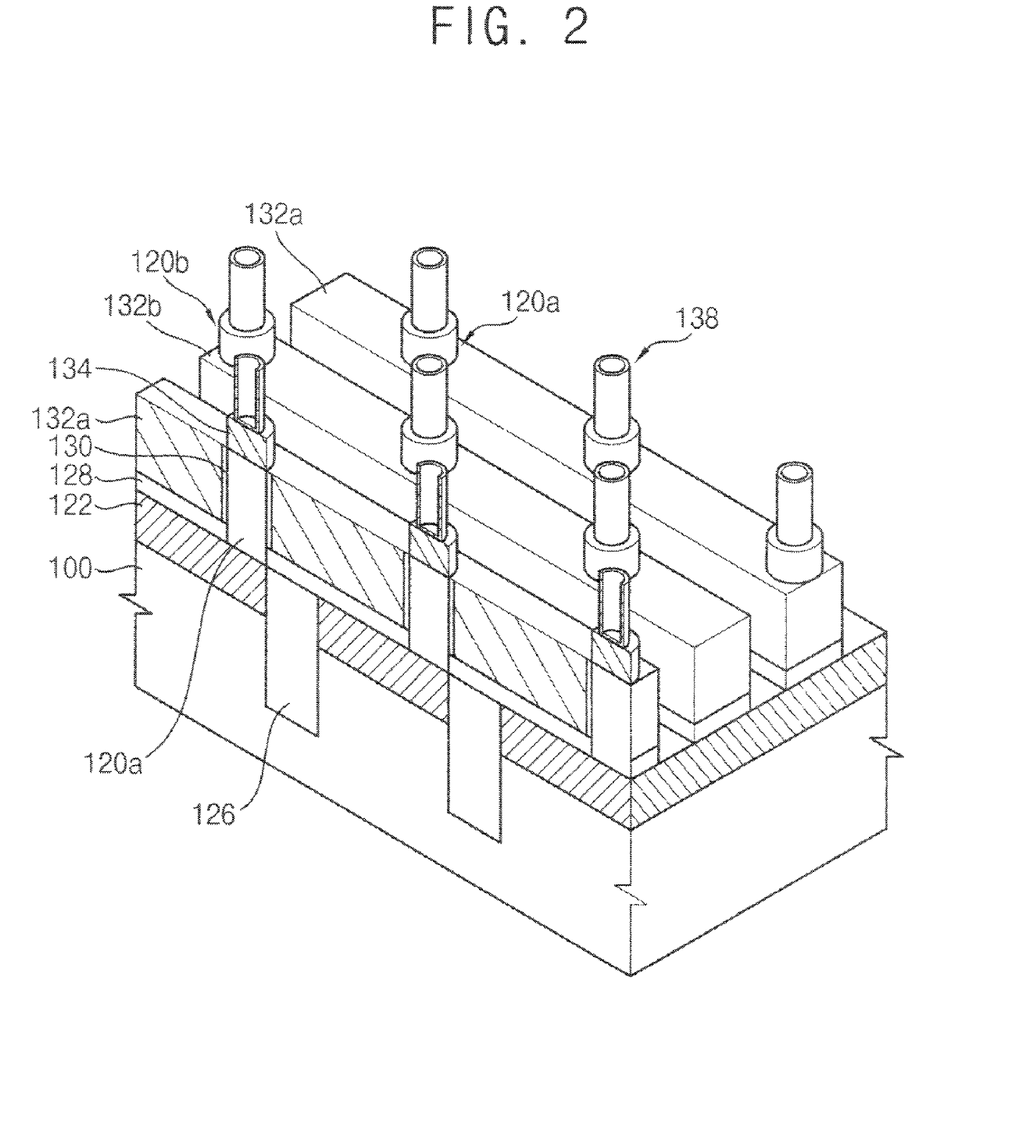
FIG. 2 is a perspective view of the semiconductor memory device.

Referring to FIGS. 1 and 2, a substrate 100 of a semiconductor memory device according to the inventive concept has active regions separated from one another by isolation regions 126 in the substrate 100. The substrate 100 may be a semiconductor substrate or a substrate having a semiconductor layer thereon. For example, the substrate 100 may be a silicon substrate, a germanium substrate, a silicon-germanium substrate, a silicon-on-insulator (SOI) substrate, or a germanium-on-insulator (GOI) substrate. Each of the active regions extends in a first direction. In this respect, the active regions may be linear regions of the substrate 100, respectively. In this case, the isolation regions 126 are interposed between adjacent active regions, and each of the isolation regions 126 comprises a linear segment of insulating material that is elongated in the first direction. In the example of the semiconductor memory device shown in FIGS. 1 and 2, the active regions are substantially wider than the isolation regions 126.

In addition, first active pillar structures 120a protrude from the active regions of the substrate 100. In this respect, the first active pillar structures 120a may be constituted by parts the substrate 100, respectively. That is, a generally planar bottom portion of the substrate and the first active pillar structures 120a may be unitary. The first active pillar structures 120a are disposed in an array of odd rows and even columns, each odd column extending in a first direction and each even row extending in a second direction perpendicular to the first direction. The first active pillar structures 120a of each row thereof are spaced from each other by a first pitch (P1), i.e., a spacing in the second direction.

Second active pillar structures 120b also protrude from the active regions of the substrate. Like the first active pillar structures 120a, the second active pillar structures 120b may be constituted by parts the substrate 100, respectively. Also, the second active pillar structures 120b are disposed in an array of even rows and odd columns, each odd column extending in the first direction and each even row extending in the second direction. The second active pillar structures 120b of each row thereof may also be spaced from each other by the first pitch (P1).

The first and second active pillar structures 120a and 12b may have substantially the same or substantially similar shapes. Furthermore, the first and second active pillar structures 120a and 12b may have substantially the same or substantially similar sizes. For example, the first and second active pillar structures 120a and 12b may have circular cross-sectional shapes, and a diameter of the upper surfaces of the first pillar structures 120a may be substantially the same as or substantially similar to a diameter of the upper surfaces of the second active pillar structures 120b. Furthermore, each of the first and the second active pillar structures 120a and 120b may have a lower portion, and an upper portion that is narrower than its lower portion. That is, the first and the second active pillar structures 120a and 120b may each have a step between upper and lower portions thereof.

In any case, the rows of second pillar structures 120b are alternately disposed, in the first direction, with the rows of first pillar structures 120a. (Hence, the reference to odd and even rows of first and second pillar structures 120a and 120b, respectively). Likewise, the odd columns of second pillar structures 120b are alternately disposed, in the second direction, with the odd rows of first pillar structures 120a. (Hence, the reference to even and odd columns of first and second pillar structures 120a and 120b, respectively). Moreover, the columns of the second active pillar structures 120b are spaced from the columns of the first active pillar structures 120a by a second pitch (P2), i.e., a spacing in the second direction. That is, the group of second pillar structures 120b is offset in the second direction from the group of first active pillar structures 120a by an amount equal to the second pitch (P2). Accordingly, respective ones of the first and the second active pillar structures 120a and 120b are alternately disposed along each of a series of lines extending diagonally with respect to the first and second directions.

In this respect, as shown best in FIG. 1, a first line connecting one second active pillar structure 120b and a first active pillar structure 120a adjacent one another along one of the diagonals, and a second line connecting the same second active pillar structure 120b and a second active pillar structure 120b adjacent one another in one of the rows, subtend an acute angle (R) in a range of about 20 degrees to about 70 degrees. That is, the diagonals along which the first and second active pillars 120a and 120b are alternately disposed intersect the rows along which the active pillars 120a (or 120b) are disposed at the angle (R). In one example embodiment, the angle (R) is about 45 degrees to provide the greatest density of active pillar structures, i.e., to maximize the degree to which the device can be integrated.

Still referring to FIG. 1 and FIG. 2, in the present embodiment, one respective column of the first active pillar structures 120a and one column of the second active pillar structures 120b adjacent thereto are disposed at each active region. The first active pillar structures 120a of each column thereof are spaced from one another by a third pitch (P3), i.e., a spacing in the first direction. Likewise, the second active pillar structures 120b of each column thereof are spaced from one another by the third pitch (P3). The third pitch (P3) may be about 3.5 times to about 5 times larger than the upper diameter of the active pillar structures spaced apart by the third pitch (P3).

Buried bit lines 122 are disposed between the substrate 100 and the first and the second active pillar structures 120a and 120b. Also, adjacent buried bit lines 122 are spaced from one another in the second direction across relatively narrow gaps. In the example of the present embodiment, the buried bit lines 122 are constituted by an upper portion of the substrate 100 doped with impurities. Each of the buried bit lines 122 may further include a metal silicide film disposed on the substrate 100.

Each buried bit line 122 may be connected to the lower portions of the first active pillar structures 120a in a respective one of the even columns and to lower portions of the second active pillar structures 120b in one of the odd columns adjacent to the even column. Thus, each buried bit line 122 may have a width (L) substantially equal to or greater than a sum of an upper diameter of one first active pillar structure 120*a*, an upper diameter of one second active pillar structure 120*b*, and a distance between the adjacent columns of the first and second active pillar structures 120*a* and 120*b*. Furthermore, the width (L) of the buried bit line 122 may be substantially less than the sum of the upper diameter of one first active pillar structure 120*a*, the upper diameter of one second active pillar structure 120*b*, and twice the distance between the adjacent columns of first and second active pillar structures 120*a* and 120*b*.

First gate patterns each enclose central portions of the first active pillar structures 120*a* disposed in a row. Thus, the first gate patterns are each elongated in the second direction. Each of the first gate patterns includes first gate insulation layers 130 and a first gate electrode 132*a*. The first gate insulation layers 130 extend along the sides of the first active pillar structures 120*a*, respectively. The first gate electrode 132*a* is disposed on the first gate insulation layers 130.

Likewise, second gate patterns each enclose central portions of the second active pillar structures 120*b* disposed in a row. Thus, the second gate patterns are also elongated in the second direction, and the first and second gate patterns are alternately disposed in the first direction. Each of the second gate patterns include second gate insulation layers (not illustrated) and a second gate electrode 132*a*. The second gate insulation layers extend along the sides of the second active pillar structure 120*b*, respectively. The second gate electrode 132*b* is disposed on the second gate insulation layer.

Furthermore, a distance (d) between adjacent ones of the first and second gate electrodes 132*a* and 132*b* may be substantially less than width of the first gate electrode 132*a* and/or the second gate electrode 132*b*. For example, the distance (d) is in a range of about 0.4 to about 0.8 of the width of the first gate electrode 132*a* and/or the second gate electrode 132*b*. In the example of the present embodiment, the first gate electrodes 132*a* and the second gate electrodes 132*b* have substantially the same or substantially similar shapes and widths and so, the distance (d) is in a range of about 0.4 to about 0.8 of the width of each of the first and second gate electrodes 132*a* and 132*b*.

An insulation layer pattern 128 is disposed between the substrate 100 and the first and the second gate electrodes 132*a* and 132*b* such that the first and the second gate electrodes 132*a* and 132*b* are electrically insulated from the substrate 100 by the insulation layer pattern 128. Additionally, the first and the second gate electrodes 132*a* and 132*b* may be disposed directly on the insulation layer pattern 128 so as to be directly supported by the insulation layer pattern 128.

Impurity regions 134 serving as source/drain regions are provided at portions of the first and the second active pillar structures 120*a* and 120*b* adjacent to the first and the second gate electrodes 132*a* and 132*b*, respectively.

Finally, the semiconductor memory device may also include capacitors 138 electrically connected to the first and the second active pillar structures 120*a* and 120*b*. In this case, the capacitors 138 are connected to the source/drain regions 134, respectively.

Figure 3:
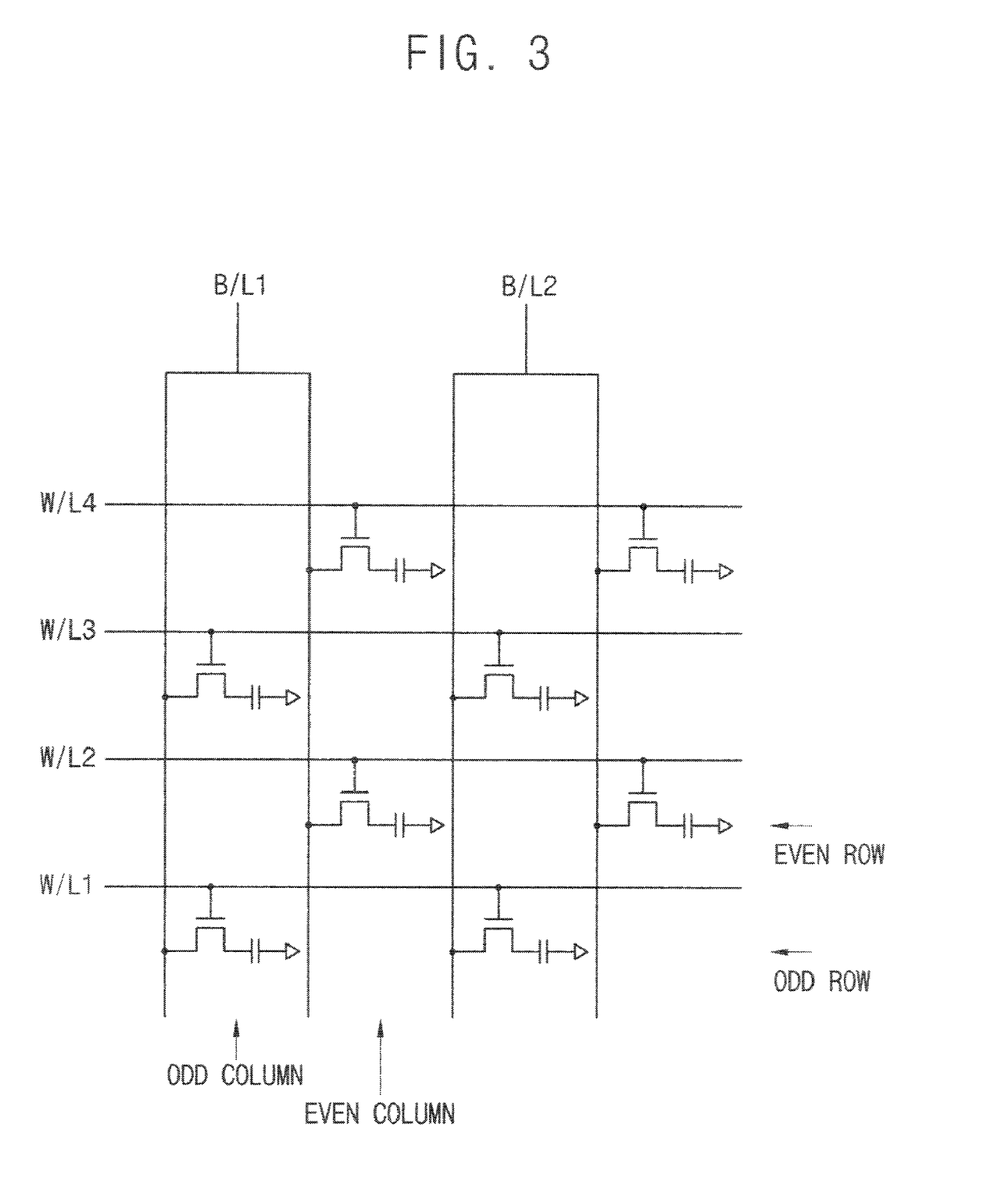
FIG. 3 is an equivalent circuit diagram of the semiconductor memory device illustrated in FIGS. 1 and 2.

FIG. 3 is an equivalent circuit diagram of the semiconductor memory device shown in and described above with reference to FIGS. 1 and 2. Data may be recorded in the semiconductor memory device by storing charges, such as electrons, in channel regions of the vertical pillar type of transistors. In the example of the present embodiment according to the inventive concept, the semiconductor memory device is a dynamic random access memory (DRAM) device including an array of memory cells each having one transistor and one capacitor.

Referring to FIG. 3, the semiconductor memory device includes a plurality of word lines (W/L1, W/L2, W/L3 and W/L4). The word lines (W/L1, W/L3 and W/L4) respectively connect first unit cells disposed in each of several odd rows, and second unit cells disposed in each of several even rows. That is, rows of first unit cells and rows of second unit cells are alternatively disposed (hence, the reference to odd and even rows), and each word line W/L connects the unit cells of a respective row thereof. The semiconductor memory device further includes a plurality of bit lines (B/L1 and B/L2). Each of the bit lines (B/L1 and B/L2) is electrically connected to a column of the first unit cells and an adjacent column of the second unit cells (odd and even columns of the unit cells). Thus, each of the bit lines (B/L1 and B/L2) is relatively wide and thus, has a correspondingly low resistance. Accordingly, the semiconductor memory device has a relatively high response speed.

A method of manufacturing a semiconductor memory device in accordance with the inventive concept will now be described with reference to FIGS. 4 to 12.

Figure 4:
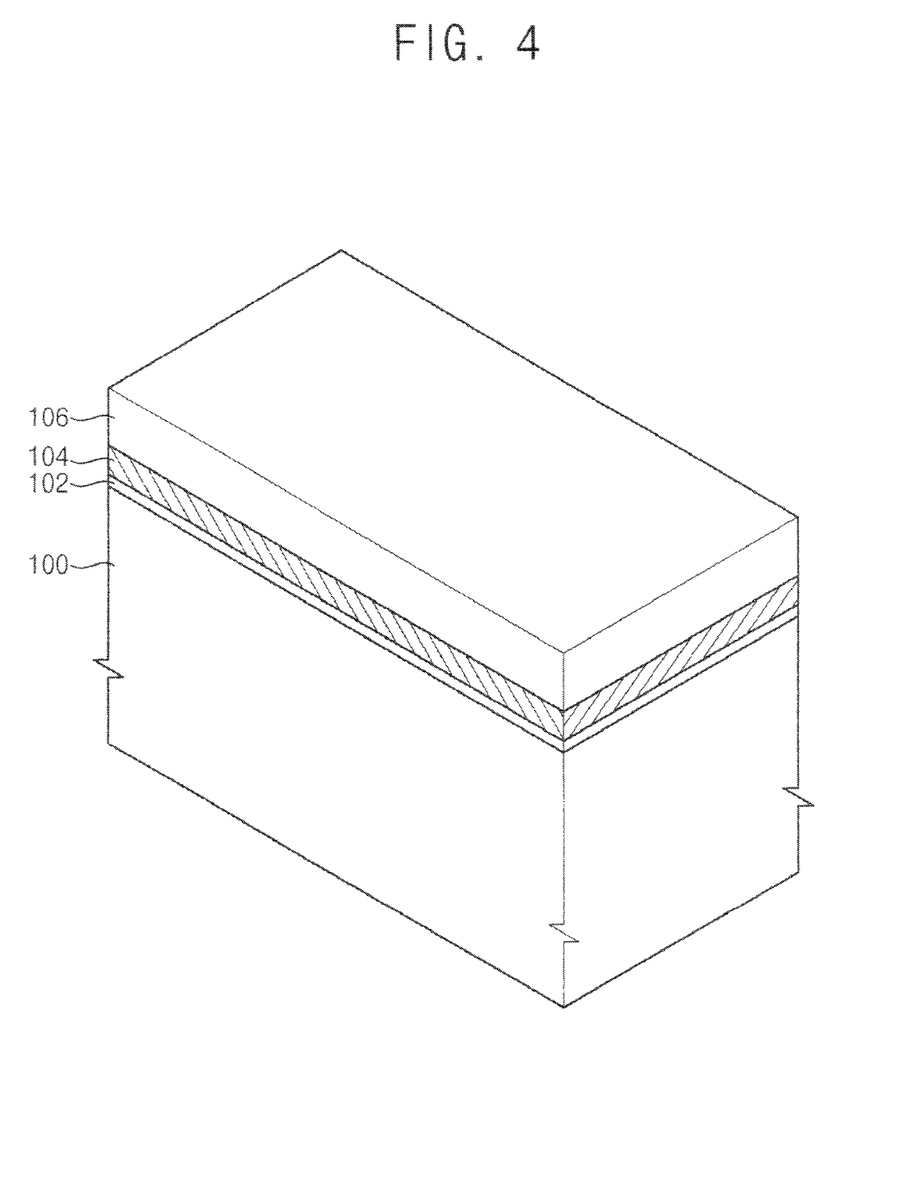
FIGS. 4 to 12 are each a perspective view of a substrate and together illustrate an embodiment of a method of manufacturing a semiconductor memory device in accordance with the inventive concept.

Referring first to FIG. 4, a pad oxide layer 102 is formed on a substrate 100. The substrate 100 may be a substrate of single crystalline semiconductor material. For example, the substrate 100 may be a single crystalline silicon substrate, or a single crystalline germanium substrate. The pad oxide layer 102 may comprise silicon oxide formed by a thermal oxidation process or a chemical vapor deposition (CVD) process.

A hard mask layer 104 is formed on the pad oxide layer 102. The hard mask layer 104 is formed of material having an etching selectivity with respect to the pad oxide layer 102 and the substrate 100. For example, the hard mask layer 104 may be a nitride such as silicon nitride, or an oxynitride such as silicon oxynitride.

A photoresist film 106 is formed on the hard mask layer 104. The photoresist film 106 may be formed by a spin coating process.

Figure 5:
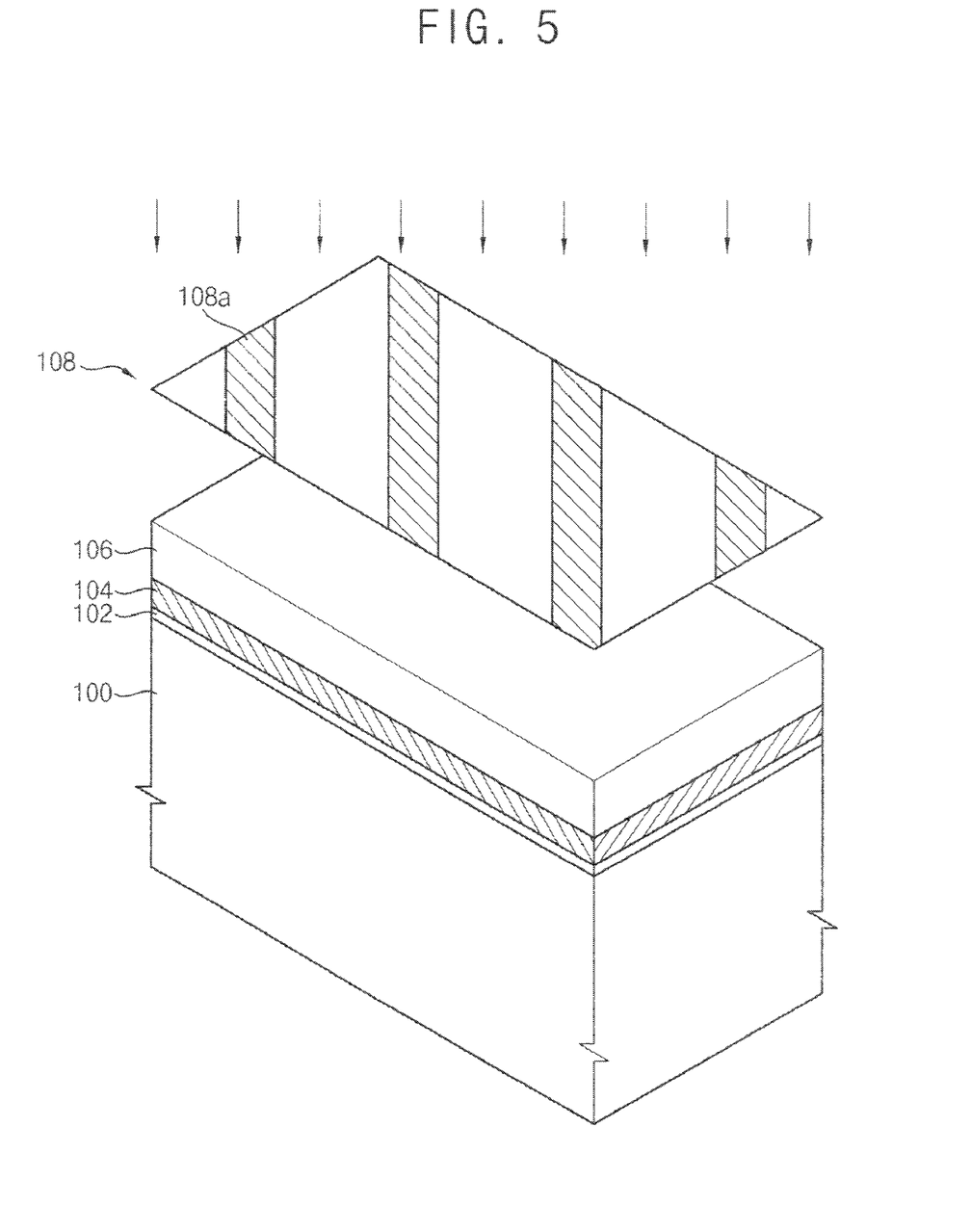

Referring to FIG. 5, a first exposure mask 108 is placed over the photoresist film 106. In the example of the present embodiment, the first exposure mask 108 bears a pattern 108*a* of diagonally extending light-shielding lines. The photoresist film 106 is exposed through the first exposure mask 108 so that regions of the photoresist, other than those extending along lines that are oblique with respect to the first and second directions, are exposed.

Figure 13:
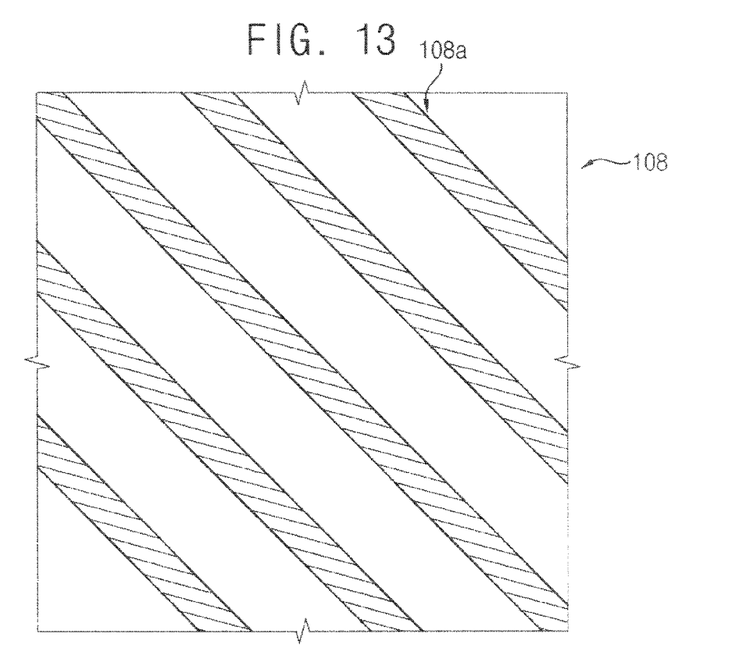
FIG. 13 is a plan view of an exposure mask used during the stage shown in FIG. 5 of the method of manufacturing a semiconductor memory device in accordance with the inventive concept.

FIG. 13 is a plan view illustrating the first exposure mask 108 including the first exposure pattern 108*a* in FIG. 5. During the first exposure process, the diagonal lines of the first pattern 108*a* (and hence, the non-exposed regions of the photoresist) are oriented at an angle of about 20 degrees to about 70 degrees relative to a predetermined direction, i.e., relative to a reference axis extending parallel to the plane of the substrate (in this case, the second direction). In one example embodiment, the diagonal lines of the first pattern 108*a* subtend an angle of about 45 degrees with respect to the reference axis.

Figure 6:
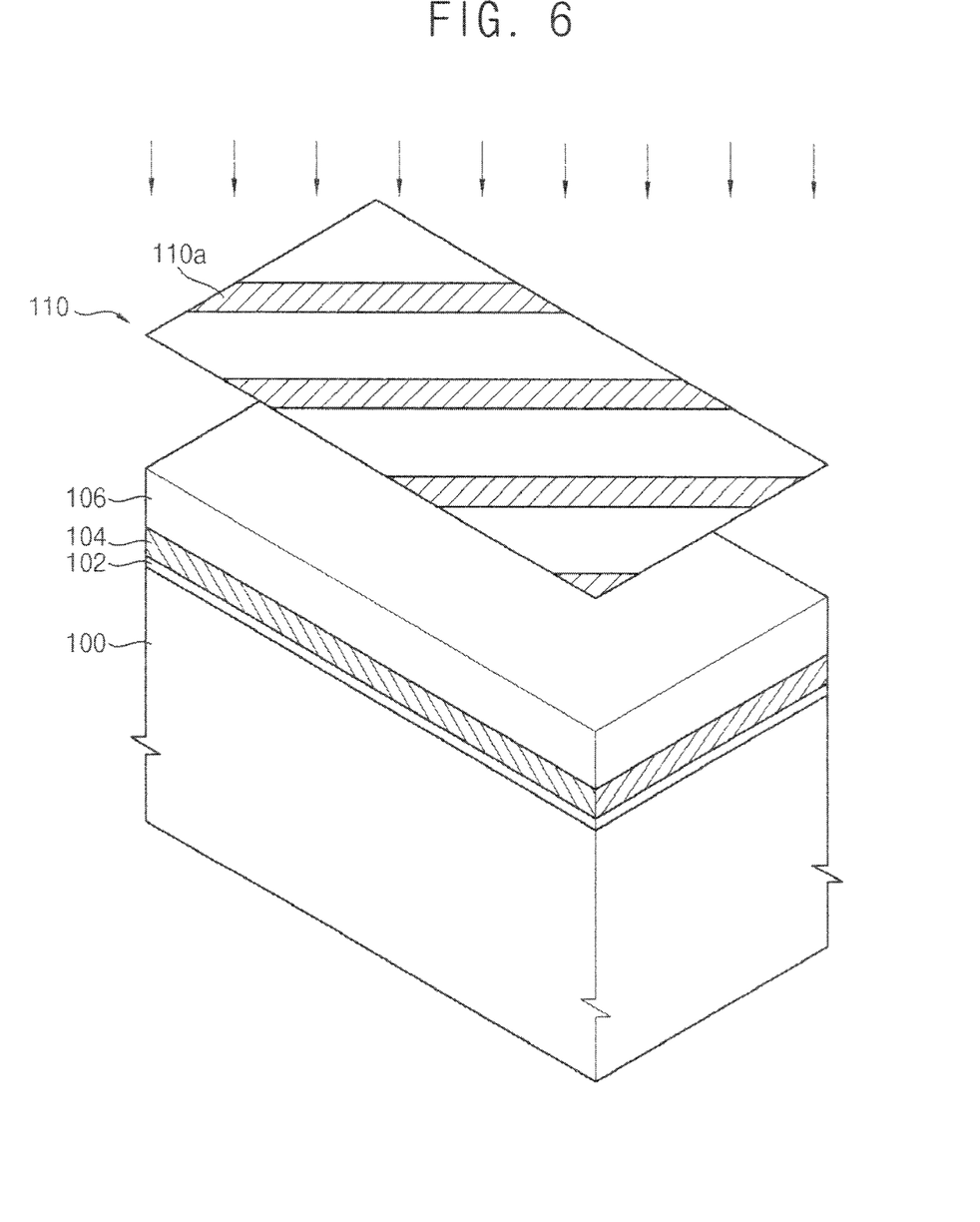
Figure 14:
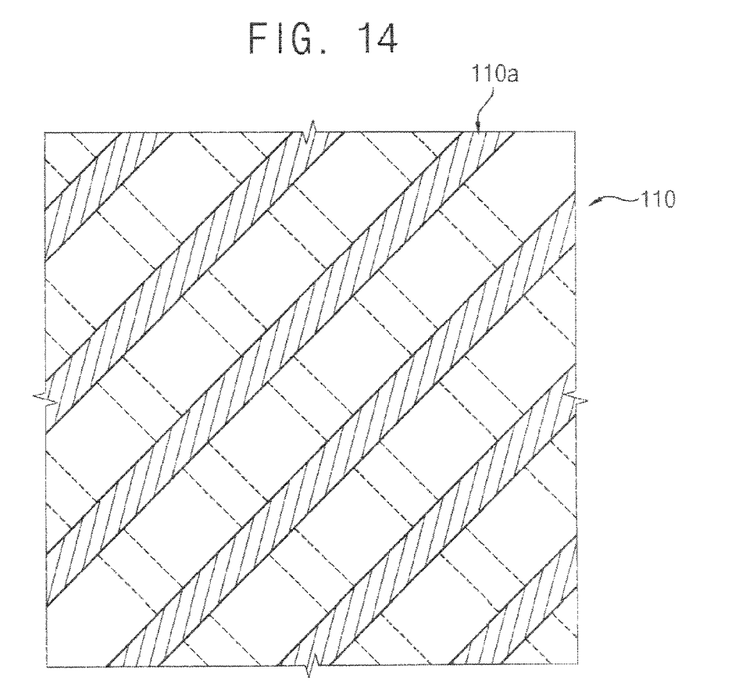
FIG. 14 is a plan view of an exposure mask used during the stage shown in FIG. 6 of the method of manufacturing a semiconductor memory device in accordance with the inventive concept.

Referring to FIG. 6, a second exposure mask 110 having a pattern 110*a* of diagonally extending light-shielding lines is placed over the photoresist film 106*a*, and the photoresist film 106 is exposed through the second exposure mask 110. The diagonally extending light-shielding lines of the second pattern 110*a* are oriented so as to extend at an angle with respect to the reference axis, and in this case substantially perpendicular to the diagonally extending light-shielding lines of the first pattern 108a during the exposure processes. FIG. 14 is a plan view of the second exposure mask 110 having the second pattern 110a.

When the first and the second exposure processes are executed on the photoresist film 106, portions of the photoresist film 106 corresponding to the regions in which the first and the second patterns 108a and 110a would have overlapped, if in place at the same time during the first and the second exposure processes, are not exposed to light. On the other hand, the other portions of the photoresist film 106 are exposed to the light (represented by the arrows in FIGS. 5 and 6).

Figure 7:
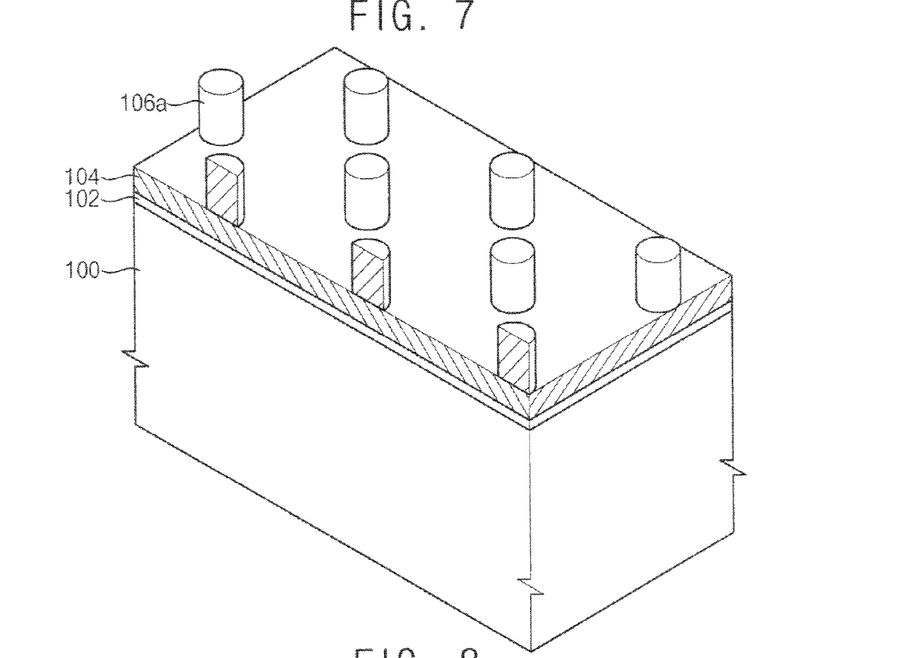

Referring to FIG. 7, the photoresist film 106 exposed in the first and the second exposure processes is baked and developed to form a photoresist pattern 106a on the hard mask layer 106. That is, the exposed portions of the photoresist film 106 are removed through the developing process, and the resulting photoresist pattern 106a consists of unexposed portions of the photoresist film 106 at locations where the first and the second patterns 108a and 110a of the exposure masks 108 and 110 would have overlapped during the first and the second exposure processes. Thus, the photoresist pattern 106a has the form of a plurality of discrete pillars.

As an alternative to the first and second discrete exposure process described above, a single exposure process can be used to form the photoresist pattern. For example, the photoresist film 106 can be exposed using one exposure mask that has a pattern corresponding to both sets of the diagonally extending light-shielding lines of the first and second patterns 108a and 110a.

Figure 8:
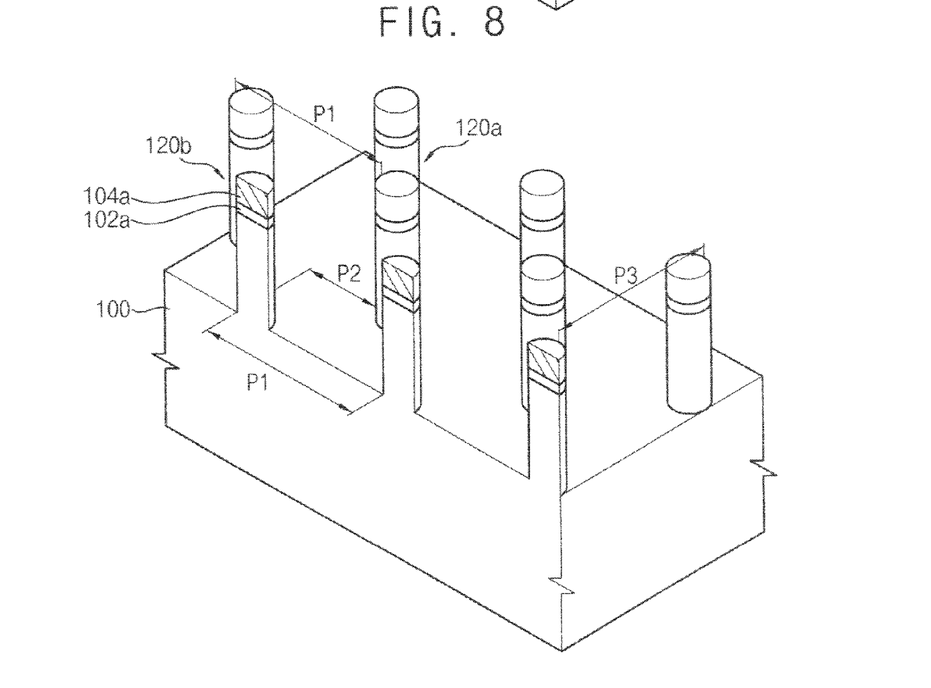

In any case, the effect is that the photoresist is exposed at regions thereof except for those along first lines (corresponding to the first pattern 108a) extending obliquely with respect to each of the first and second directions and along second lines (corresponding to the second pattern 110a) extending at angles with respect to the first lines and obliquely with respect to the second direction In any case, referring to FIG. 8, the hard mask layer 104 and the pad oxide layer 102 are etched using the photoresist pattern 106a as an etching mask to form a hard mask pattern 104a and a pad oxide pattern 102a on the substrate 100. The pad oxide pattern 102a is interposed between the substrate 100 and the hard mask pattern 104a. Then, the photoresist pattern 106a is removed from the hard mask pattern 104a. The photoresist pattern 106a may be removed by an ashing process and/or a stripping process.

In the embodiment of the method described so far, the pillars of the photoresist pattern 106a are formed using first and the second exposure processes, and the hard mask pattern 104a is formed using the photoresist pattern 106a so as to be nearly identical to the photoresist pattern 106a. Thus, adjacent features, i.e., pillars, of the hard mask pattern 104a are formed close to one another.

Figure 15:
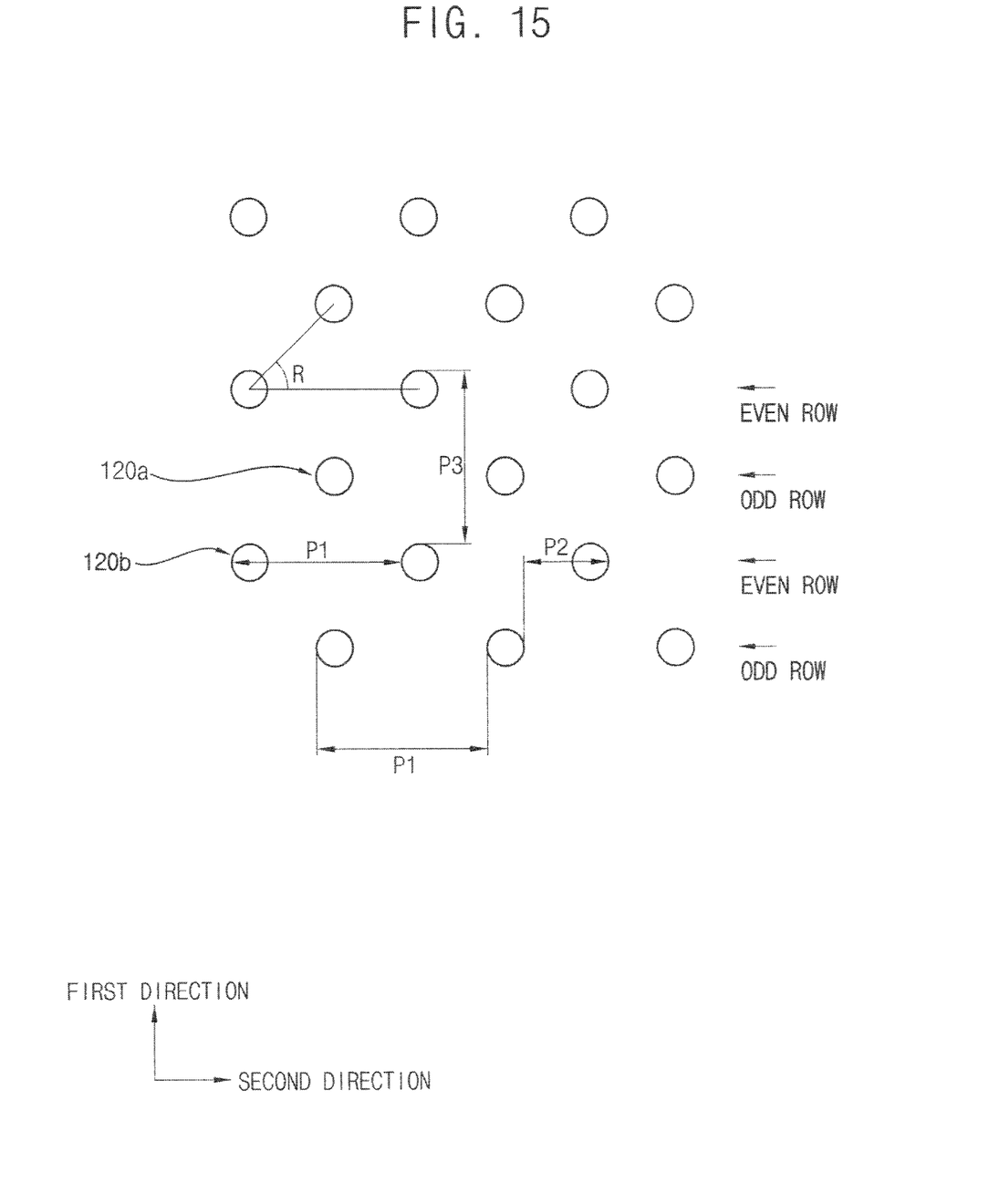
FIG. 15 is a diagram of the layout of first and second active pillar structures formed at the stage shown in FIG. 8 of the method of manufacturing a semiconductor memory device in accordance with the inventive concept.

The substrate 100 is then etched using an anisitropic etching process and the hard mask pattern 104a as an etching mask to form active pillar structures 120a and 120b. Thus, the active pillar structures 120a and 120b are parts of the substrate 100. FIG. 15 is a plan view of the first and the second active pillar structures 120a and 120b in FIG. 8. Reference may be made to FIG. 1 for a description of the layout, sizes and shapes, etc. of the first and the second active pillar structures 120a and 120b illustrated in FIG. 15.

Figure 9:
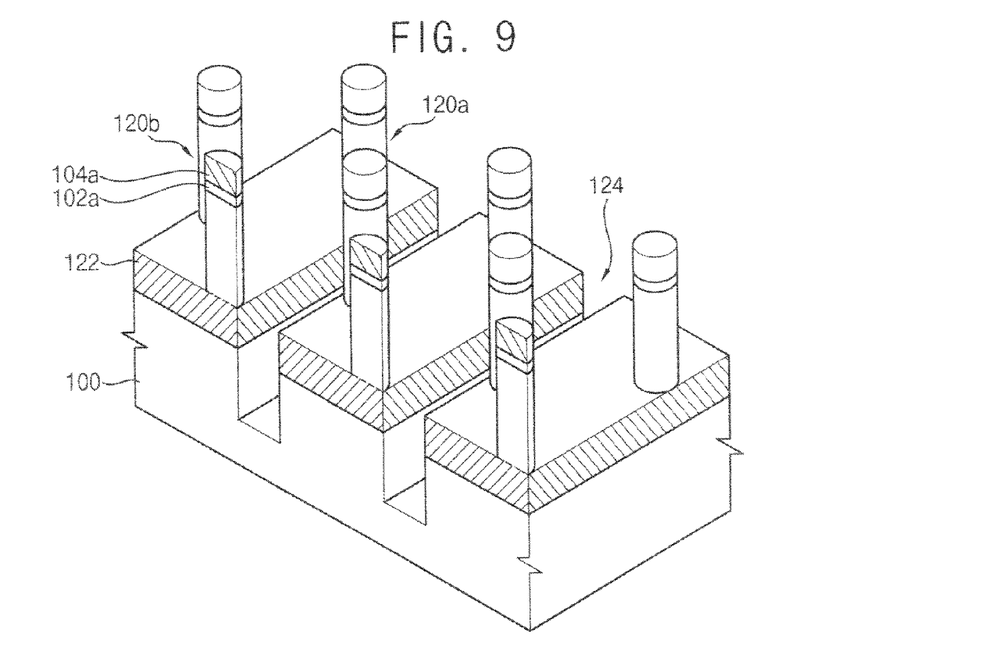

Referring to FIG. 9, insulation layers (not illustrated) are formed on the first and the second active pillar structures 120a and 120b, respectively. The insulation layers are conformally formed along the first and the second active pillar structures 120a and 120b. Impurities are doped into portions of the substrate 100 exposed between the first and the second active pillar structures 120a and 120b to form preliminary buried bit lines (not illustrated) on the substrate 100. At this time, the impurities diffuse toward lower portions of the first and the second active pillar structures 120a and 120b.

A mask (not illustrated) for forming active regions is then formed on the substrate 100. The mask has a pattern of lines which each cover one column of the first active pillar structures 120a and an adjacent column of the second pillar structures 120b. The mask may be formed of a nitride or oxynitride.

The portion of the substrate 100 exposed between the lines of the mask is etched to form trenches 124 in the substrate 100. At this time, portions of the preliminary buried bit lines are removed to form buried bit lines 122 beneath the first and the second active pillar structures 120a and 120b. The buried bit lines 122 may serve as source regions or drain regions of the vertical pillar type of transistors. Subsequently, the mask is removed from the substrate 100. The unetched portions of the substrate 100 between the trenches 124 serve as active regions of the semiconductor memory device.

According to method described above, the etching process for forming the trenches 124 may be easily carried out because the active regions are designed to be relatively wide. Additionally, the buried bit lines 122 are also designed to be relatively wide. Therefore, the electrical characteristics of the semiconductor memory device are enhanced due to the relatively low resistances of the buried bit lines 122.

Figure 10:
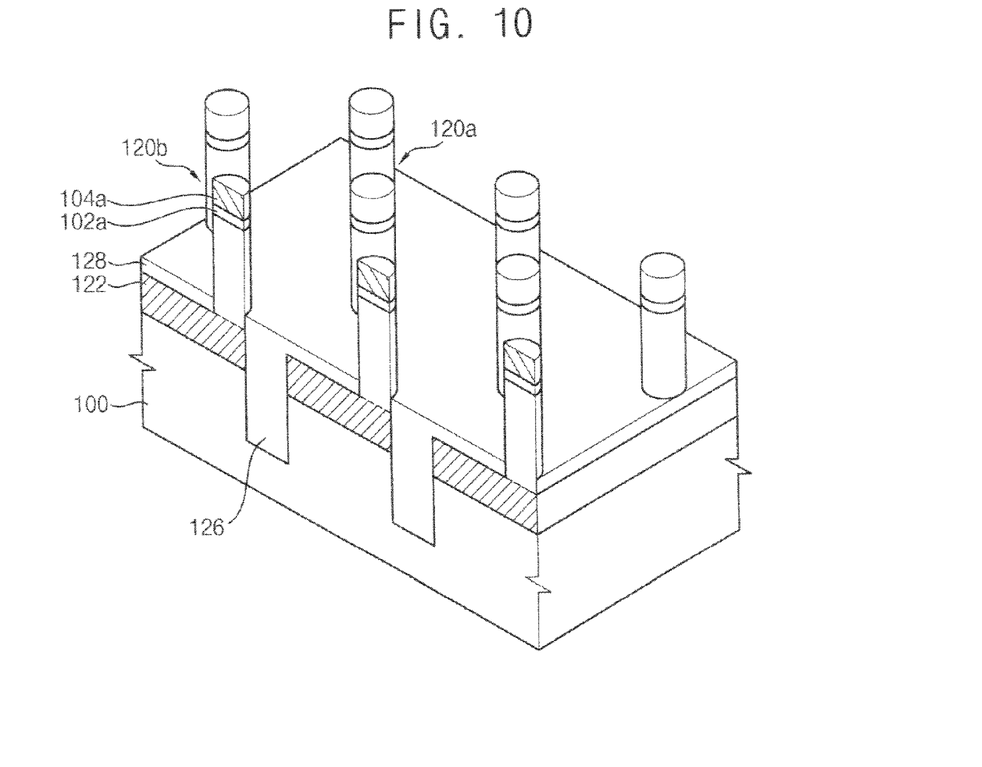

Referring to FIG. 10, an isolation layer pattern 126 of insulating material is formed in the trenches 124. For example, the isolation layer pattern 126 is formed of an oxide such as undoped silicate glass (USG), spin on glass (SOG), flowable oxide (FOX), boro-phosphor silicate glass (BPSG), phosphor silicate glass (PSG), Tonen Silazane (TOSZ), tetra ethyl ortho silicate (TEOS), plasma enhanced-TEOS (PE-TEOS), or a high density plasma-chemical vapor deposition (HDP-CVD) oxide. Furthermore, an insulation layer 128 is formed on the substrate 100 between the first active pillar structures 120a and the second active pillar structures 120b.

In an example of the present embodiment, the isolation layer pattern 126 and the insulation layer 128 are formed together by overfilling the trenches 124 with the insulating material and then removing an upper portion of the resulting layer of insulating material. For example, the isolation layer pattern 126 and the insulation layer pattern 128 may be formed by an etch-back process. In this case, the insulation layer 128 and the isolation layer pattern 126 are unitarily formed. Thus, the insulation layer pattern 128 may also include an oxide, for example, USG, SOG, FOX, BPSG, PSG, TOSZ, TEOS, PE-TEOS, or an HDP-CVD oxide.

Also, the layer of insulating material may be formed to such a thickness as to cover the first and the second active pillar structures 120a and 120b. In this case, the etch-back process exposes the first and the second active pillar structures 120a and 120b while the isolation layer pattern 126 and the insulation layer 128 are formed.

Figure 11:
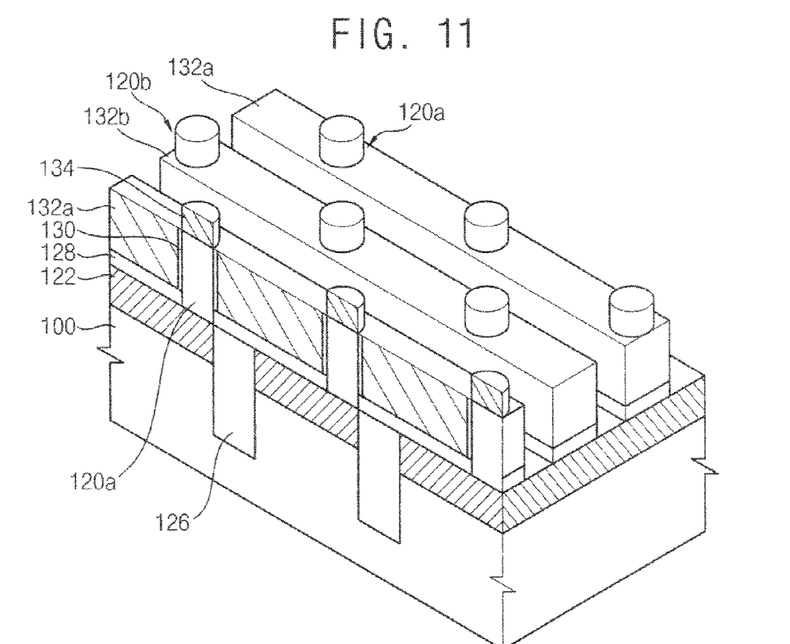

Referring to FIG. 11, gate insulation layers 130 are formed on the first and the second active pillar structures 120a and 120b. The gate insulation layers 130 may be formed by a thermal oxidation process. In this case, the gate insulation layers 130 may comprise silicon oxide.

A conductive layer (not illustrated) is formed on the substrate 100 around the gate insulation layers 130. The conductive layer may comprise polysilicon, a metal and/or a metal compound. For example, the conductive layer may be formed of polysilicon doped with impurities, tungsten, titanium, tantalum, aluminum, tungsten nitride, aluminum nitride, titanium nitride, tantalum nitride, combinations thereof. The conductive layer may be formed to such a thickness as to cover the first and the second active pillar structures 120a and 120b. In this case, an upper portion of the conductive layer is removed by an etch-back process until upper portions of the first and the second active pillar structures 120a and 120b are exposed.

The conductive layer is then patterned to form first and second gate electrodes 132a and 132b each extending longitudinally along a second direction substantially perpendicular to the direction along which each of the buried bit lines 122 extend longitudinally. Again, reference maybe had to the description of FIGS. 1 and 2 for a more detailed description of the first and second gate electrodes 132a and 132b.

The hard mask pattern 104a is then removed from the first and the second active pillar structures 102a and 102b. Impurities are doped into portions of the first and the second active pillar structures 120a and 120b protruding from the first and the second gate electrodes 132a and 132b, so that impurity regions 134 are formed at upper portions of the first and the second active pillar structures 120a and 120b. The impurity regions 134 may serve as the source regions or the drain regions of the vertical pillar type of transistors.

Figure 12:
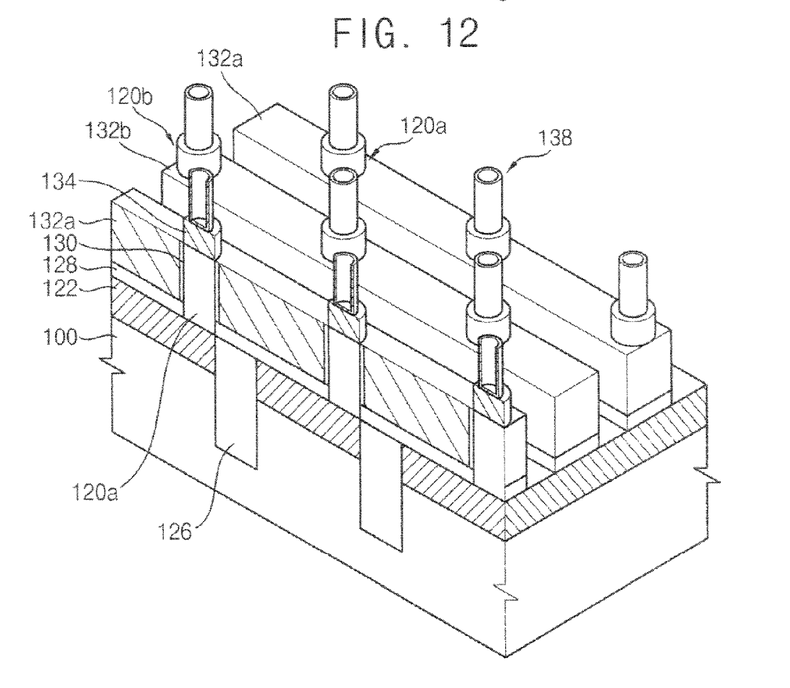

Referring to FIG. 12, capacitors 138 are formed on the first and the second active pillar structures 120a and 120b. The capacitors 138 are also electrically connected to the first and the second active pillar structures 120a and 120b, respectively. In the illustrated example of the present embodiment, the lower electrodes of the capacitors 138 are connected directly to upper surfaces of the first and the second active pillar structures 120a and 120b. Alternatively, contact plugs or pads (not illustrated) may be formed on the upper surfaces of the first and the second active pillar structures 120a and 120b, and then the lower electrodes of the capacitors 138 may be formed on the contact plugs or pads.

Each of the capacitors 138 may have cylindrical lower electrodes. Alternatively, the capacitors 138 may each have a stacked structure including a flat lower electrode, and a dielectric layer and upper electrode stacked on the lower electrode.

According to the inventive concept as described above, a semiconductor memory device includes a dense arrangement of vertical pillar type of transistors. Thus, the semiconductor device may have a high degree of integration. Furthermore, the semiconductor memory device includes buried bit lines each electrically connected to adjacent columns of active pillar structures of the transistors. Therefore, the buried bit lines are relatively wide and have correspondingly low resistances. Thus, the semiconductor memory device may possess a high response speed.

Finally, embodiments of the inventive concept have been described herein in detail. The inventive concept may, however, be embodied in many different forms and should not be construed as being limited to the embodiments described above. Rather, these embodiments were described so that this disclosure is thorough and complete, and fully conveys the inventive concept to those skilled in the art. Thus, the true spirit and scope of the inventive concept is not limited by the embodiments described above but by the following claims.

What is claimed is:

1. A semiconductor memory device, comprising:
    rows and columns of active pillar structures comprising semiconductor material, each of the active pillar structures protruding from a surface of the device,
    wherein odd and even rows of the active pillar structures are alternately disposed in a first direction,
    odd and even columns of the active pillar structures are alternately disposed in a second direction,
    the odd rows and the even columns of the active pillar structures each consist of a plurality of first ones of the active pillar structures,
    the even rows and the odd columns of the active pillar structures each consist of a plurality of second ones of the active pillar structures, and
    the columns of the second active pillar structures are offset in the second direction from the columns of the first active pillar structures;
    buried bit lines each extending longitudinally in the first direction, and each of the buried bit lines electrically connected to the first pillar structures which make up one of the even columns of the active pillar structures and to the second active pillar structures which make up an adjacent one of the odd columns of the active pillar structures, and electrically connected to the first and second active pillar structures at lower portions thereof;
    first gate patterns each extending longitudinally in the second direction and respectively enclosing central portions of the first active pillar structures which make up one of the odd rows of the active pillar structures; and
    second gate patterns each extending longitudinally in the second direction and respectively enclosing central portions of the second active pillar structures which make up one of the even rows of the active pillar structures,
    wherein the first and the second gate patterns are spaced apart from each other in the first direction by intervals each smaller than respective widths of the first gate patterns and respective widths of the second gate patterns.

2. The semiconductor memory device as claimed in claim 1, further comprising:
    a substrate having active regions elongated in the first direction, each of the first pillar structures which make up one of the even columns of the active pillar structures and the second active pillar structures which make up an adjacent one of the odd columns of the active pillar structures protruding from one of the active regions; and
    isolation regions between the active regions.

3. The semiconductor memory device as claimed in claim 2, wherein the buried bit lines are doped upper portions of the active regions of the substrate, respectively.

4. The semiconductor memory device as claimed in claim 1, wherein a width of each buried bit line is equal to or greater than a sum of a diameter of an upper portion of one of the first active pillar structures, a diameter of an upper portion of one of the second active pillar structures, and a distance between the adjacent even and odd columns of the active pillar structures made up of the first and second active pillar structures to which the buried bit line is electrically connected, and
    wherein the width of each buried bit line is less than a sum of the diameter of an upper portion of one of the first active pillar structures, the diameter of an upper portion of one of the second active pillar structures, and twice the distance between the adjacent even and odd columns of the active pillar structures made up of the first and second active pillar structures to which the buried bit line is electrically connected.

5. The semiconductor memory device as claimed in claim 1, wherein the first active pillar structure have substantially the same size and shape as the second active pillar structures.

6. The semiconductor memory device as claimed in claim 1, wherein sets of the second active pillar structures and adjacent first active pillar structures disposed along diagonal lines, respectively, and each of the diagonal lines and a line that connects the second active pillar structures which make up one of the odd rows of the active pillar structures subtend an angle in a range of about 20 degrees to about 70 degrees.

7. The semiconductor memory device as claimed in claim 6, wherein the angle is about 45 degrees.

8. The semiconductor memory device as claimed in claim 1, further comprising:
capacitors electrically connected to the first and the second active pillar structures.

9. A semiconductor memory device, comprising:
rows and columns of active pillar structures comprising semiconductor material, each of the active pillar structures protruding from a surface of the device,
wherein odd and even rows of the active pillar structures are alternately disposed in a first direction,
odd and even columns of the active pillar structures are alternately disposed in a second direction,
the odd rows and the even columns of the active pillar structures each consist of a plurality of first ones of the active pillar structures,
the even rows and the odd columns of the active pillar structures each consist of a plurality of second ones of the active pillar structures, and
the columns of the second active pillar structures are offset in the second direction from the columns of the first active pillar structures;
buried bit lines each extending longitudinally in the first direction, and each of the buried bit lines electrically connected to the first pillar structures which make up one of the even columns of the active pillar structures and to the second active pillar structures which make up an adjacent one of the odd columns of the active pillar structures, and electrically connected to the first and second active pillar structures at lower portions thereof;
first gate patterns each extending longitudinally in the second direction and respectively enclosing central portions of the first active pillar structures which make up one of the odd rows of the active pillar structures; and
second gate patterns each extending longitudinally in the second direction and respectively enclosing central portions of the second active pillar structures which make up one of the even rows of the active pillar structures,
wherein a width of each of the buried bit lines is substantially the same as or greater than a sum of a diameter of an upper portion of one of the first active pillar structures, a diameter of an upper portion of one of the second active pillar structures, and a distance between the adjacent even and odd columns of the active pillar structures made up of the first and second active pillar structures to which the buried bit line is electrically connected.

10. A semiconductor memory device, comprising:
a plurality of active pillar structures comprising semiconductor material, the plurality of active pillar structures comprising first active pillar structures arranged in odd rows and even columns of the plurality of active pillar structures, and second active pillar structures arranged in even rows and odd columns of the plurality of active pillar structures, wherein the odd and even rows are alternately disposed in a first direction and the odd and even columns are alternately disposed in a second direction, and the odd columns of the second active pillar structures are offset in the second direction from the even columns of the first active pillar structures;
buried bit lines each extending longitudinally in the first direction, the first pillar structures of one of the even columns and the second active pillar structures of an adjacent one of the odd columns protruding from a surface of each of the buried bit lines;
first gate patterns extending longitudinally in the second direction, each first gate pattern enclosing a portion of each of the first active pillar structures in one of the odd rows; and
second gate patterns each extending longitudinally in the second direction, each second gate pattern enclosing a portion of each of the second active pillar structures in one of the even rows,
wherein the first gate patterns are spaced apart from adjacent second gate patterns in the first direction by intervals smaller than respective widths of the first gate patterns and respective widths of the second gate patterns.

11. The semiconductor memory device as claimed in claim 10, further comprising:
a substrate having active regions elongated in the first direction and respectively corresponding to the buried bit lines; and
isolation regions between the active regions.

12. The semiconductor memory device as claimed in claim 11, wherein the buried bit lines are doped upper portions of the active regions of the substrate, respectively.

13. The semiconductor memory device as claimed in claim 10, further comprising:
capacitors electrically connected to the first and second active pillar structures.

14. A semiconductor memory device, comprising:
a plurality of active pillar structures comprising semiconductor material, the plurality of active pillar structures comprising first active pillar structures arranged in odd rows and even columns of the plurality of active pillar structures, and second active pillar structures arranged in even rows and odd columns of the plurality of active pillar structures, wherein the odd and even rows are alternately disposed in a first direction and the odd and even columns are alternately disposed in a second direction, and the odd columns of the second active pillar structures are offset in the second direction from the even columns of the first active pillar structures;
buried bit lines each extending longitudinally in the first direction, the first pillar structures of one of the even columns and the second active pillar structures of an adjacent one of the odd columns protruding from a surface of each of the buried bit lines;
first gate patterns extending longitudinally in the second direction, each first gate pattern enclosing a portion of each of the first active pillar structures in one of the odd rows; and
second gate patterns each extending longitudinally in the second direction, each second gate pattern enclosing a portion of each of the second active pillar structures in one of the even rows,
wherein a width of each of the buried bit lines is substantially the same as or greater than a sum of a diameter of one of the first active pillar structures, a diameter of one of the second active pillar structures, and a distance between the even column of the one of the first active pillar structure and an adjacent odd column of the one of the second active pillar structure.

15. The semiconductor memory device as claimed in claim 14, further comprising:
a substrate having active regions elongated in the first direction and respectively corresponding to the buried bit lines; and
isolation regions between the active regions.

16. The semiconductor memory device as claimed in claim 15, wherein the buried bit lines are doped upper portions of the active regions of the substrate, respectively.

17. The semiconductor memory device as claimed in claim 14, further comprising: capacitors electrically connected to the first and second active pillar structures.

* * * * *